United States Patent
Chang et al.

(10) Patent No.: US 6,770,382 B1
(45) Date of Patent: Aug. 3, 2004

(54) GMR CONFIGURATION WITH ENHANCED SPIN FILTERING

(75) Inventors: Jei-Wei Chang, Cupertino, CA (US); Bernard Dieny, Lans en Vercors (FR); Mao-Min Chen, San Jose, CA (US); Cheng Horng, San Jose, CA (US); Kochan Ju, Fremont, CA (US); Simon Liao, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/443,447

(22) Filed: Nov. 22, 1999

(51) Int. Cl.$^7$ .................... G11B 5/127; B32B 15/04; B32B 15/18

(52) U.S. Cl. .................... 428/632; 428/694 T; 428/680; 428/213; 428/220; 360/324.1; 360/324.11; 360/324.12; 360/313

(58) Field of Search .................. 428/632, 692, 428/693, 670, 674, 675, 676, 678, 679, 680, 681, 694 T, 694 TM, 900, 212, 213, 220; 360/113, 324.11, 324.12, 313, 324.1; 324/252; 338/32 R; 427/127, 128, 132, 101, 103, 123, 126.3

(56) References Cited

U.S. PATENT DOCUMENTS

| | | | |
|---|---|---|---|
| 5,668,688 A | 9/1997 | Dykes et al. | 360/113 |
| 5,766,743 A | 6/1998 | Fujikata et al. | 428/212 |
| 5,780,176 A | 7/1998 | Iwasaki et al. | 428/692 |
| 5,843,589 A | 12/1998 | Hoshiya et al. | 428/692 |
| 6,175,477 B1 * | 1/2001 | Lin et al. | 360/324.11 |
| 6,181,534 B1 * | 1/2001 | Gill | 360/324.11 |
| 6,219,210 B1 * | 4/2001 | Pinarbasi | 360/324.11 |
| 6,222,707 B1 * | 4/2001 | Huai et al. | 360/324.1 |
| 6,292,336 B1 * | 9/2001 | Horng et al. | 360/324.12 |
| 6,303,218 B1 * | 10/2001 | Kamiguchi et al. | 428/332 |
| 6,306,266 B1 * | 10/2001 | Metin et al. | 204/192.12 |
| 6,498,707 B1 * | 12/2002 | Gao et al. | 360/324.11 |

* cited by examiner

*Primary Examiner*—Michael La Villa
(74) *Attorney, Agent, or Firm*—George O. Saile; Stephen B. Ackerman

(57) ABSTRACT

A Spin Valve GMR and Spin Filter SVGMR configuration where in the first embodiment an important buffer layer is composed of an metal oxide having a crystal lattice constant that is close the $1^{st}$ FM free layer's crystal lattice constant and has the same crystal structure (e.g., FCC, BCC, etc.). The metal oxide buffer layer enhances the specular scattering. The spin valve giant magnetoresistance (SVGMR) sensor comprises: a seed layer over the substrate. An important metal oxide buffer layer (buffer layer) over the seed layer. The metal oxide layer preferably is comprised of NiO or alpha-$Fe_2O_3$. A free ferromagnetic layer over the metal oxide layer. A non-magnetic conductor spacer layer over the free ferromagnetic layer. A pinned ferromagnetic layer ($2^{nd}$ FM pinned) over the non-magnetic conductor spacer layer and a pinning material layer over the pinned ferromagnetic layer. In the second embodiment, a high conductivity layer (HCL) is formed over the buffer layer to create a spin filter -SVGMR. The HCL layer enhances the GMR ratio of the spin filter SVGMR. The third embodiment is a pinned FM layer comprised of a three layer structure of an lower AP layer, a spacer layer (e.g., Ru) and an upper AP layer.

12 Claims, 2 Drawing Sheets

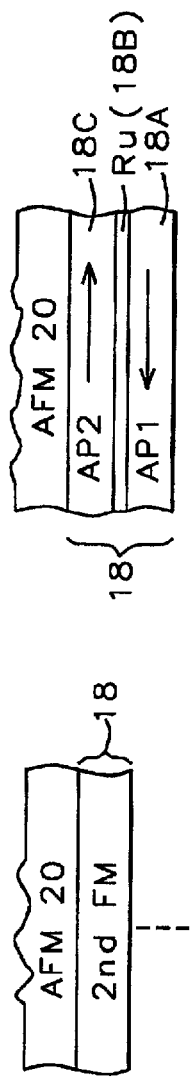
FIG. 3A
FIG. 3B
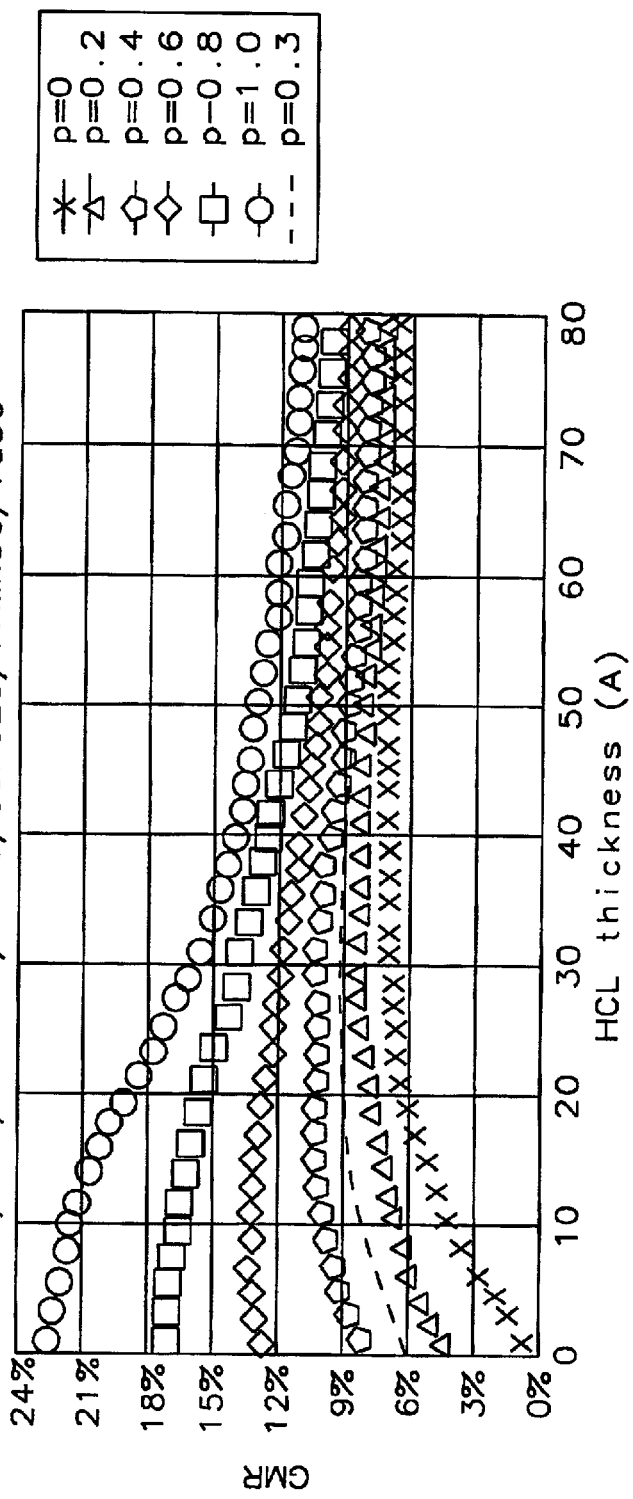
FIG. 4

GMR CONFIGURATION WITH ENHANCED SPIN FILTERING

BACKGROUND OF INVENTION

1) Field of the Invention

This invention relates generally to fabrication of magnetoresistive (MR) sensors employed within data storage and retrieval. More particularly, the present invention related to enhanced magnetoresistive (MR) spin valve filtering giant magnetoresistance (GMR) sensor elements.

2) Description of the Prior Art

In recent years, improvement in sensitivity of magnetic sensors and increase in density of magnetic recording are advancing. Concomitantly, development of magnetoresistance effect magnetic sensors (hereinafter abbreviated to MR sensors) and magnetoresistance effect magnetic heads (hereinafter abbreviated to MR heads) is making rapid progress. Each of the MR sensors and the MR heads is operable to read an external magnetic field signal as an electric resistance variation in a sensor in response to the external magnetic field. In these MR sensors and MR heads, reproduction outputs do not depend upon relative speeds with respect to recording media. This leads to high sensitivity of the MR sensors and high output levels of the MR head in high-density magnetic recording.

Recently, proposal is made of a magnetoresistance effect film which comprises at least two ferromagnetic layers or thin films stacked one over the other with a nonmagnetic layer or thin film interposed therebetween, and an antiferromagnetic layer or thin film underlying a first one of the ferromagnetic thin films so that the first ferromagnetic thin film is provided with antimagnetic force, that is, constrained by exchange anisotropy or exchange biasing.

A so-called soft magnetic material or a high permeability magnetic material is usually used for the ferromagnetic layers. The term "nonmagnetic" is usually used to mean "paramagnetic" and/or "diamagnetic".

When an external magnetic field is applied to the magnetoresistance effect film, the direction of magnetization of the other second one of the ferromagnetic thin films is rotated with respect to that of the first ferromagnetic film. Thus, change in resistance takes place.

Disclosure is also made of a conventional magnetic read transducer, called an MR sensor or an MR head, which can read data from a magnetic surface with high linear density. The MR sensor detects a magnetic field signal through change in resistance as a function of the intensity and the direction of magnetic flux detected by a reading element. The above-mentioned conventional MR sensor is operated on the basis of an anisotropic magnetoresistance (AMR) effect. Specifically, one component of the resistance of the reading element changes in proportion to the square of the cosine of the angle between the magnetization direction and the direction of the sense current flowing through the element.

More recently, disclosure is made of a further remarkable magnetoresistance effect. Specifically, change in resistance of a stacked-type magnetic sensor results from spin-dependent transmission of conduction electrons between ferromagnetic layers with a nonmagnetic layer interposed therebetween and from interfacial spin-dependent scattering accompanying the spin-dependent transmission. Such magnetoresistance effect is called by various names such as "a giant magnetoresistance effect" and "a spin-valve effect".

Such magnetoresistance effect sensor made of an appropriate material has improved sensitivity and exhibits large rate of change in resistance. In the MR sensor of the type described, in-plane resistance between a pair of the ferromagnetic layers separated by the nonmagnetic layer changes in proportion to the cosine of the angle between magnetization directions in the two ferromagnetic layers.

It has been recognized that the electronic and structural natures of interfaces are key elements in the understanding of mechanism behind GMR effects. Improved electron reflectivity in the GMR/Insulator interface was found to improve significantly the GMR ratio.

There is a need to improve the electron reflectivity in the GMR/Insulator interface. This invention is directed towards this end.

The importance of overcoming the various deficiencies noted above is evidenced by the extensive technological development directed to the subject, as documented by the relevant patent technical literature. The closest and apparently more relevant technical developments in the patent literature can be gleaned by considering U.S. Pat. No. 5,943,589(Hoshiya et al.) and U.S. Pat. No. 5,766,743 (Fujikata et al.).

SUMMARY OF THE INVENTION

It is an object of the present invention to provide a method for fabricating a giant magnetoresistance (GMR) with an enhanced spin filtering.

It is an object of the present invention to provide a structure for a spin filtering GMR configuration with an enhanced signal amplitude.

It is towards the forgoing objectives and other objective apparent in the specification below that the invention is directed.

The GMR configuration of the invention, in the first embodiment (a SVGMR), has an important buffer layer 13 composed of an metal oxide having a crystal lattice constant that is close the $1^{st}$ FM free layer's crystal lattice constant and has the same crystal structure (e.g., FCC, BCC, etc.). This metal oxide under layer replaces the Ta conductor used in the inventor's previous process. The invention's metal oxide buffer layer enhances the specular scattering. The invention's buffer layer is comprised of oxides of metals that have a similar crystal lattice structure and constant to the adjacent FM layer.

In the second embodiment (a spin filter -SVGMR), a high conductivity layer (HCL or filtering layer) is formed over the buffer layer. The HCL layer enhances the GMR ratio of the spin filter SVGMR. The buffer layer is a key element of the Spin filter GMR sensor of the second embodiment.

In the third embodiment of the invention, the pinned ferromagnetic layer ($2^{nd}$ FM pinned ) is composed of a three layer structure comprising: (a) a lower AP1 layer, a nonmagnetic spacer (e.g., Ru) layer and an upper AP layer (AP2 layer) wherein the spacer layer induces anti-ferromagnetic coupling between AP1 and AP2 which enhances the pinning effect. The buffer layer 13 is present in the GMR sensor of the third embodiment.

A preferred first embodiment of the invention's spin valve giant magnetoresistance (SVGMR) sensor comprises: a substrate; a seed layer over the substrate, the seed layer being formed of a magnetoresistive resistivity sensitivity enhancing material selected from the group consisting of nickel chromium alloys, nickel -chromium-copper alloys and nickel-iron-chromium alloys; a metal oxide layer (Buffer layer) over the seed layer; said metal oxide layer comprised of NiO (nickel oxide) or alpha $Fe_2O_3$ (alpha ferros oxide); a free ferromagnetic layer over said metal oxide layer; a non-magnetic conductor spacer layer over said free ferromagnetic layer; a pinned ferromagnetic layer ($2^{nd}$ FM pinned) over the non-magnetic conductor spacer layer; and a pinning material layer over the pinned ferromagnetic layer; and a capping layer over said pinning material layer.

The second embodiment of the invention is a Spin filter SVGMR that further includes: a high conductivity layer (HCL) on said metal oxide layer and said free ferromagnetic layer on said high conductivity layer (HCL). The HCL layer changes a spin valve GMR to a spin filter GMR.

A third embodiment of the invention is a pinned FM layer comprised of a three layer structure of an lower AP layer (e.g., AP1), a spacer layer (e.g., Ru) and an upper AP layer (AP2). The AP1 and AP2 layers have anti-parallel magnetic orientation. AP stands for anti-parallel.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 3A is a Cross sectional view of the invention's $2^{nd}$ FM layer 18 and the overlying AFM layer 20.

FIG. 3B is a Cross-sectional view of the a preferred embodiment invention's $2^{nd}$ FM layer 18 (comprised of 3 layers- AP1, Ru AP2) and the overlying AFM layer 20.

FIG. 4 shows a graph of the simulated results of a spin filter SV having the configuration 509Ta/HCL/CoFe/Cu25/CoFe20/IrNm50/Ta50. The graph shows the GMR ratio of the Spin Filter spin valve as a function of interface specular scattering. The results of the Ta interface is represent by the dashed line (p=0.3). Significant gain in the GMR ratio if the specular scatter factor is improved such as by the $2^{nd}$ embodiment's HCL layer.

DESCRIPTION OF THE PREFERRED EMBODIMENT

Figure 1:
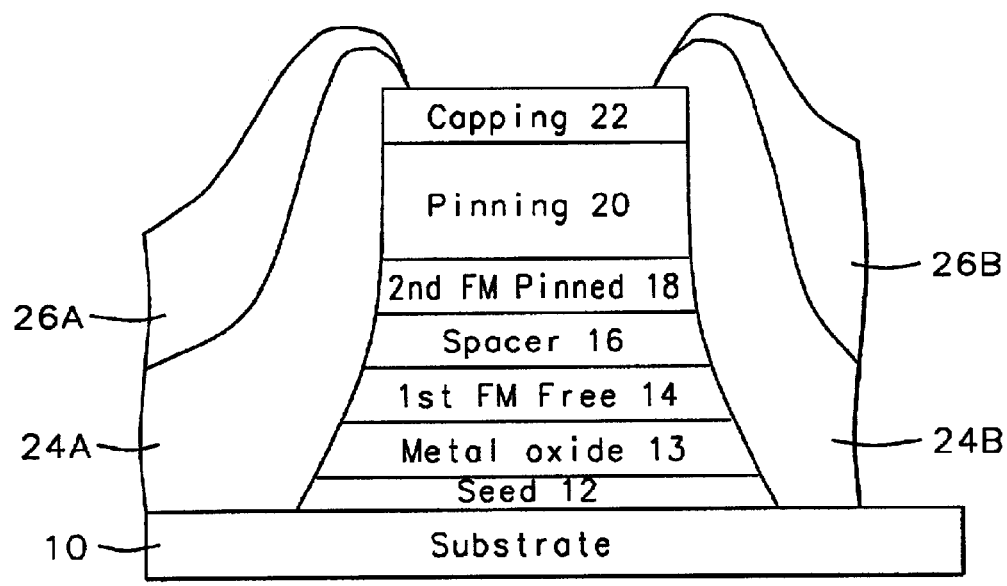
FIG. 1 shows a schematic air bearing surface (ABS) view diagram illustrating a spin Valve giant magnetoresistance (SVGMR) sensor element fabricated in accord with a preferred first embodiment of the present invention

The present invention provides a method for forming a giant magnetoresistive (GMR) sensor element, along with the giant magnetoresistive (GMR) sensor element formed in accord with the method, where the giant magnetoresistive (GMR) sensor element has an enhanced magnetoresistive (MR) resistivity sensitivity.

The GMR configuration of the invention, in the first embodiment, has an important buffer layer 13 composed of an metal oxide having a crystal lattice constant that is close the $1^{st}$ FM free layer's 14 crystal lattice constant and has the same crystal structure (e.g., FCC, BCC, etc.). This metal oxide under layer 13 replaces the Ta conductor used in the inventor's previous process. The invention's metal oxide buffer layer 13 enhances the specular scattering. The invention's buffer layer 13 is comprised of oxides of metals that have a similar crystal lattice structure and constant to the adjacent FM layer 14.

In the second embodiment (See FIG. 2), a high conductivity layer (HCL) 30 is formed over the buffer layer 13. The HCL layer enhances the GMR ratio of the spin filter SVGMR. See FIG. 4.

In the third embodiment of the invention, the pinned ferromagnetic layer 18 ($2^{nd}$ FM pinned See FIG. 3A) is composed of a three layer structure comprising: (a) a lower AP1 layer (18A), a non- magnetic spacer (e.g., Ru) layer 18B and a upper AP layer (AP2 layer) 18C wherein the spacer layer 18B induces anti-ferromagnetic coupling between AP1 and AP2 which enhances the Pinning effect. The AP1 and AP2 layers have anti-parallel magnetic orientation. AP stands for anti-parallel.

A preferred first embodiment of the invention's spin valve giant magnetoresistance (SVGMR) sensor comprises: a substrate 10; a seed layer 12 over the substrate 10, the seed layer 12 being formed of a magnetoresistive resistivity sensitivity enhancing material selected from the group consisting of nickel chromium alloys, nickel-chromium-copper alloys and nickel-iron-chromium alloys; a metal oxide layer 13 (Buffer layer) over the seed layer; said metal oxide layer 13 comprised of NiO or alpha Fe2O₃; a free ferromagnetic layer 14 over said metal oxide layer 13; a non-magnetic conductor spacer layer 16 over said free ferromagnetic layer 14, a pinned ferromagnetic layer 18 ($2^{nd}$ FM pinned) over the non-magnetic conductor spacer layer 16; and a pinning material layer 20 over the pinned ferromagnetic layer 18; and a capping layer 22 over said pinning material layer.

The second embodiment of the invention is a Spin filter SVGMR that further includes: a high conductivity layer (HCL) 30 on said metal oxide layer 13 and said free ferromagnetic layer 14 on said high conductivity layer (HCL).

A third embodiment of the invention is a pinned FM layer comprised of a three layer structure of an lower AP layer, a spacer layer (e.g., Ru) and an upper AP layer.

The table below is a summary of the major element of the invention.

TABLE

Summary of 1st and 2nd embodiments of the invention

| Layer | Characteristics | Preferred Materials | Preferred parameters |
|---|---|---|---|
| Capping layer 22 | | NiFeCr, NiCr, Ta | (40 to 60 Å) |
| Pinning layer 20 | | MnPt, IrMn, MnNi, etc. | |
| pinned layer 18 | | CoFe, Co | 20–30Å |
| spacer layer 16 - (non-magnetic conductor) | | Cu | 20–30Å |
| first free layer (FM Ferromagnetic) Layer 14 | pinned by ② buffer/AFM layer | CoFe, CoFe/NiFe, Co/NiFe. | |
| High conductivity layer 30 (2nd Embodiment - optional) | Spin valve SV has HCL layer 30 | Cu, CuNi, | 10–30Å |
| **Invention's Key buffer (metal oxide) layer 13 | Matches Crystal lattice of free layer (FM) 14 | NiO, alpha —$Fe_2O_3$, | |
| Substrate 10 with upper Shield | | Substrate can be comprised of $Al_2O_3$ and upper shield is preferably composed of NiFe | |

Note: this specification uses the common representation used in the industry regarding nomenclature for layers. For example, the term "Co/NiFe" (for the layer 14) denotes a lower Co layer with an overlaying NiFe layer.

A. First Embodiment—SV Giant Magnetoresistance (GMR) with Metal Oxide Buffer Layer 13

Referring now to FIG. 1, there is shown a schematic air bearing surface (ABS) view diagram illustrating a giant magnetoresistance (GMR) sensor element fabricated in accord with a preferred embodiment of the present invention.

B. Substrate 10

Shown in FIG. 1 is a substrate 10 having formed thereover, among other layers, a seed layer 12, which in turn has formed thereupon a metal oxide (e.g., nickel oxide) material layer 13, which in turn has formed thereupon a free ferromagnetic layer 14. Within the preferred embodiment of the present invention with respect to the substrate 10, the seed layer 12, the nickel oxide material layer 13 and the free ferromagnetic layer 14, each of the substrate 10, the seed layer 12, the nickel oxide material layer 13 and the free ferromagnetic layer 14 may be formed employing methods and materials as are either generally known or conventional in the art of magnetoresistive (MR) sensor element fabrication, although, as discussed below, some aspects of the nickel oxide material layer 13 are presumably neither generally known nor conventional in the art of magnetoresistive (MR) sensor element fabrication.

For example, although it is known in the art of magnetoresistive (MR) sensor element fabrication that-substrates are typically formed from non-magnetic ceramic materials such as but not limited to oxides, nitrides, borides and carbides, as well as homogeneous and heterogeneous mixtures of oxides, nitrides, borides and carbides, for the preferred embodiment of the present invention, the substrate 10 is preferably formed from a non-magnetic aluminum oxide titanium carbide ceramic material, where the upper surface of the substrate 10, although not specifically illustrated within the schematic cross-sectional diagram of FIG. 1, typically and preferably has formed thereupon and thus incorporated therein a dielectric layer, typically and preferably (although not exclusively) formed of an aluminum oxide material, upon which dielectric layer is formed the seed layer 12. Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval, although, as noted above, a giant magnetoresistive (GMR) sensor element fabricated in accord with the present invention, such as the simple spin-valve magnetoresistive (NM) sensor element fabricated in accord with the preferred embodiment of the present invention, may be employed within other digitally encoded magnetic data storage and transduction applications, as well as analog magnetic data storage and transduction applications.

Specifics of fabrication of a giant magnetoresistive (GMR) sensor element, such as the spin-valve magnetoresistive (SVMR) sensor element of the preferred embodiment of the present invention, into a direct access storage device (DASD) magnetic data storage enclosure employed within digitally encoded magnetic data storage and retrieval are generally conventional in the art of direct access storage device (DASD) magnetic data storage enclosure fabrication and are thus not provided here. Such details may be found, however, within various portions of the prior art references cited within the Description of the Related Art, all of the teachings of which prior art references are incorporated herein fully by reference.

C. Seed Layer 12

Within the preferred embodiment of the present invention with respect to the seed layer 12, the seed layer 12 is formed of a material which enhances the magnetoresistive (NM) resistivity sensitivity of the spin valve magnetoresistive (SVMR) sensor element whose schematic air bearing surface (ABS) view diagram is illustrated within FIG. 1. Within the preferred embodiment of the present invention, it has similarly been determined experimentally that the seed layer 12 is preferably formed of either: (1) a nickel-iron-chromium alloy of nickel: iron: chromium weight ratio from about 56:14:30 to about 40:10:50, more preferably from about 53:12:35 to about 44:11:45; or (2) a nickel-chromium alloy of nickel:chromium weight ratio from about 40:60 to about 60:40, more preferably from about 45:55 to about 55:45, under conditions where at least a portion of the free ferromagnetic layer 14 which is closer to the seed layer 12 is preferably formed of a nickel-iron (permalloy) alloy of nickel:iron weight ratio from about 70:30 to about 90: 10, more preferably from about 77:23 to about 85:15. or (3) NiCrCu.

Typically and preferably, the seed layer 12 is formed to a thickness of from about 30 to about 100 angstroms and more preferably between 40 and 60 Å.

D. Metal Oxide Buffer Layer 13

The preferred embodiment of the present invention with respect to the buffer metal oxide layer 13, the buffer metal oxide layer is comprised of Nickel oxide (NiO) or alpha-$Fe_2O_3$ The buffer layer 13 preferably has a thickness of between about 5 to about 15 angstroms.

The buffer metal oxide layer 13 may be formed employing methods as are known in the art of magnetoresistive (MR) sensor element fabrication to provide a layer which is particularly thin, preferably in a range of from about 5 to about 15 angstroms. Such methods may include, but are not limited to chemical vapor deposition (CVD) methods and physical vapor deposition (PVD) sputtering methods. It is believed within the present invention that such a particularly thin nickel oxide material layer is, in comparison with antiferromagnetic dielectric nickel oxide material layers formed to substantially greater thicknesses of generally at least about 200 angstroms, formed instead as a nonmagnetic dielectric nickel oxide material layer. It is further believed that such a particularly thin nonmagnetic dielectric nickel oxide material layer in accord with the present invention and preferred embodiment of the present invention provides for enhanced specular electron scattering within a giant magnetoresistive (GMR) sensor element, such as the spin-valve magnetoresistive (SVMR) sensor element in accord with the preferred embodiment of the present invention, and consequently thus also provides an additional enhancement to a magnetoresistive.(NM) resistivity sensitivity of a giant magnetoresistive (GMR) sensor element fabricated in accord with the present invention.

More preferably, within the preferred embodiment of the present invention, the layer 13 composed of nickel oxide material formed to the thickness of from about 5 to about 15 angstroms is formed employing a reactive radio frequency sputtering method employing a nickel target and an argon/oxygen mixture sputtering atmosphere. Preferably, the reactive radio frequency sputtering method also employs: (1) a reactor chamber pressure of about 5 to about 15 mtorr; (2) a source radio frequency power of from about 50 to about 100 watts at a source radio frequency of 13.56 MHz, and a substrate bias voltage of about 30 volts watts; (3) an argon/oxygen mixture flow rate of from about 50 to about 100 standard cubic centimeters per minute (sccm); and (4) an oxygen content within the argon/oxygen mixture of from about 4 to about 12 volume percent, to provide the nickel oxide material layer 13 of nickel: oxygen atomic ratio of from about 0.8: 1.0 to about 1.0:0.8.

E. 1$^{st}$ FM Free Layer 14

Still referring to FIG. 1, the first Ferronmagnetic (FM) free layer 14 is formed over the metal oxide buffer layer 13. The free ferromagnetic layer 14 in its entirety may also be formed of other ferromagnetic materials (in place of the nickel-iron (permalloy) alloys whose compositions are noted above) while still providing enhanced magnetoresistive (MR) resistivity sensitivity of the spin-valve magnetoresistive (SVMR) sensor element whose schematic air bearing surface (ABS) view diagram is illustrated in FIG. 1. Such other ferromagnetic materials which may be employed for forming the free ferromagnetic layer 14 may include but are not limited to nickel ferromagnetic materials, iron ferromagnetic materials, cobalt ferromagnetic materials, alloys thereof, laminates thereof and laminates of alloys thereof, which have compositions such that lattice parameters of the seed layer 12 and portion of the free ferromagnetic layer 14 which is closer to the seed layer 12 are closely approximate or match.

F. Free Ferromagnetic Layer 14

Within the preferred embodiment of the present invention with respect to the free ferromagnetic layer 14 (e.g., first FM free layer), beyond the preference as disclosed above that at least a portion of the free ferromagnetic layer 14 close to the seed layer 12 or buffer layer 13 is preferably formed of a nickel-iron (permalloy) alloy ferromagnetic material (or the enumerated alternative ferromagnetic materials, provided similarity of lattice parameters), the free ferromagnetic layer 14 may, as noted above, otherwise be formed of a ferromagnetic material, or an aggregate of ferromagnetic materials, as is conventionally employed for forming free ferromagnetic layers and pinned ferromagnetic layers within spin-valve magnetoresistive (SVMR) sensor elements as are conventional in the art of spin-valve magnetoresistive (SVMR) sensor element fabrication. Such ferromagnetic materials typically include, but are not limited to nickel ferromagnetic materials, iron ferromagnetic materials and cobalt ferromagnetic materials, as well as alloys thereof, laminates thereof and laminates of alloys thereof For the preferred embodiment of the present invention, the free ferromagnetic layer 14 is preferably formed of a laminate of (1) the nickel-iron alloy layer, of composition as described above and of thickness from about 20 to about 100 angstroms formed upon the nickel oxide material layer 13; and (2) either a cobalt layer or a cobalt-iron alloy layer of up to about 20 weight percent iron, more preferably from about 5 to about 15 weight percent iron, either of the foregoing layers having a thickness from about 5 to about 20 angstroms, formed upon the nickel-iron alloy layer. The free ferromagnetic layer can be comprised of: CoFe, CoFe/NiFe, or Co/NiFe and has a thickness of 20 to 30 Å.

G. Spacer Layer 16, Pinned Layer 18, Pinning Layer 20, Capping Layer 22, Biasing Layers 24A 26A Shown also within the spin valve magnetoresistive (SVMR) sensor element whose schematic air bearing surface (ABS) view diagram is illustrated within FIG. 1 is: (1) a non- magnetic conductor spacer layer 16 formed upon the free ferromagnetic layer 14; (2) a pinned ferromagnetic layer 18 formed upon the non-magnetic conductor spacer layer 16; (3) a pinning material layer 20 formed upon the pinned ferromagnetic layer 18; and (4) a cap layer 22 formed upon the pinning material layer 20 where the preceding four layers, in conjunction with the seed layer 12, the nickel oxide material layer 13 and the free ferromagnetic layer 14, form a spin valve magnetoresistive (SVMR) stack layer 23. Finally, there is also shown within FIG. 1: (1) a pair of patterned longitudinal magnetic biasing layers 24*a* and 24*b* formed encapsulating a pair of opposite edges of the spin valve magnetoresistive (SVMR) stack layer 23; and (2) a pair of patterned conductor lead layers 26a and 26b formed and aligned upon the pair of patterned longitudinal magnetic biasing layers 24a and 24b in a fashion which defines a trackwidth of the spin valve magnetoresistive (SVMR) stack layer 23. Each of the foregoing layers may be formed employing methods and materials as are conventional in the art of spin valve magnetoresistive (SVMR) sensor element fabrication.

H. Non-magnetic Conductor Spacer Layers

For example, although it is known in the art of spin valve magnetoresistive (SVMR) sensor element fabrication that non-magnetic conductor spacer layers may be formed from non-magnetic conductor materials including but not limited to copper, gold and silver nonmagnetic conductor materials, as well as alloys thereof, laminates thereof and laminates of alloys thereof, for the preferred embodiment of the present invention, the non-magnetic conductor spacer layer 16 is preferably formed of a copper non-magnetic conductor material, formed upon the free ferromagnetic layer 14 to a thickness of from about 20 to about 30 angstroms.

I. Pinned Ferromagnetic Layer 18

In addition, although it is also known in the art of spin valve magnetoresistive (SVMR) sensor element fabrication that pinned ferromagnetic layers may be formed of ferromagnetic materials analogous or equivalent to the ferromagnetic materials employed for forming free ferromagnetic layers within spin valve magnetoresistive (SVMR) sensor elements,such ferromagnetic materials being selected from the group of ferromagnetic materials including but not limited to nickel ferromagnetic materials, iron ferromagnetic materials and cobalt ferromagnetic materials, as well as alloys thereof, laminates thereof, and laminates of alloys thereof, for the preferred embodiment of the present invention, the pinned ferromagnetic layer 18 is preferably formed of either a cobalt layer or a cobalt-iron alloy layer of up to about 20 weight percent iron, more preferably of up to about 10 weight percent iron, formed to a thickness of from about 10 to about 30 angstroms upon the non-magnetic conductor spacer layer 16.

Similarly, within the preferred embodiment of the present invention with respect to the pinning material layer 20, although it is known in the art of spin valve magnetoresistive (SVMR) sensor element fabrication that pinning-material layers may be formed of hard magnetic pinning materials including but not limited to: (1) antiferromagnetic hard magnetic pinning materials (such as but not limited to iron-manganese alloy antiferromagnetic hard magnetic pinning materials, nickel-manganese alloy antiferromagnetic hard magnetic pinning materials, platinum-manganese alloy antiferromagnetic hard magnetic pinning materials, iridium-manganese alloy antiferromagnetic hard magnetic pinning materials and higher order alloys incorporating iron-manganese alloy antiferromagnetic hard magnetic pinning materials, nickel-manganese alloy antiferromagnetic hard magnetic pinning materials, platinum-manganese alloy antiferromagnetic hard magnetic pinning materials and iridium-manganese alloy antiferromagnetic hard magnetic pinning materials); as well as (2) permanent magnet hard magnetic pinning materials (such as but not limited to cobalt-platinum permanent magnet hard magnetic pinning materials and higher order alloys incorporating cobalt-platinum permanent magnet hard magnetic pinning materials), for the preferred embodiment of the present invention, the pinning material layer 20 is preferably formed of a platinum-manganese alloy antiferromagnetic hard magnetic pinning material of platinum: manganese weight ratio from about 60:40 to about 40:60, formed to a thickness of from about 150 to about 300 angstroms upon the pinned ferromagnetic layer 18.

J. Cap Layer 22

Yet similarly, within the preferred embodiment of the present invention with respect to the cap layer 22, it is known in the art of spin-valve magnetoresistive (SVMR) sensor element fabrication that cap layers may be formed of non-magnetic conductor materials generally analogous to the non-magnetic conductor materials employed for forming non-magnetic conductor spacer layers within spin valve magnetoresistive (SVMR) sensor elements, but where such cap layers are generally formed of non-magnetic conductor materials of higher resistivity in order to limit current shunting through the cap layer. Such non-magnetic conductor materials of higher resistivity include, but are not limited to, tantalum conductor materials. Thus, for the preferred embodiment of the present invention the cap layer 22 is preferably formed of a tantalum non-magnetic conductor material formed to a thickness of from about 30 to about 100 angstroms upon the pinning material layer 20. Within the present invention, the cap layer 22 may alternatively be formed of a material analogous or equivalent to a material from which is formed the seed layer 12.

Although the cap layer 22 is optional within the spin valve magnetoresistive (SVMR) sensor element whose schematic air bearing surface (ABS) view diagram is illustrated in FIG. 1, the cap layer 22 typically provides a barrier which impedes environmental degradation of underlying layers within the spin valve magnetoresistive (SVMR) sensor element whose schematic air bearing surface (ABS) view diagram is illustrated in FIG. 1.

K. Patterned Longitudinal Magnetic Biasing Layers 24a and 24b

Finally, within the preferred embodiment of the present invention with respect to the pair of patterned longitudinal magnetic biasing layers 24a and 24b having formed and aligned thereupon the pair of patterned conductor lead layers 26a and 26b, the pair of patterned longitudinal magnetic biasing layers 24a and 24b is typically and preferably formed to a thickness of from about 200 to about 400 angstroms each while employing hard magnetic materials analogous or equivalent to the hard magnetic materials employed for forming the pinning material 18 layer 20, along with optional appropriate seed layers. Similarly, the patterned conductor lead layers 26a and 26b may be formed employing conductor lead materials as are conventional in the art of spin-valve magnetoresistive (SVMR) sensor element fabrication, such conductor lead materials including but not limited to gold, gold alloy, silver, silver alloy, copper and copper alloy conductor lead materials. For the preferred embodiment of the present invention, each patterned conductor lead layer 26a or 26b within the pair of patterned conductor lead layers 26a and 26b is preferably formed of a gold and tantalum laminated conductor lead material, preferably formed to a thickness of from about 200 to about 800 angstroms, while encapsulating the pair of opposite edges of the spin-valve magnetoresistive (SVNIR) stack layer 23 as illustrated within the schematic cross-sectional diagram of FIG. I and defining the trackwidth of the spin-valve magnetoresistive (SVMR) sensor element whose schematic air bearing surface (ABS) view diagram is illustrated in FIG. 1 of from about 0.5 to about 1.5 microns.

Upon forming the spin valve magnetoresistive (SVMR) sensor element whose schematic air bearing surface (ABS) view diagram is illustrated in FIG. 1, there is formed a spin valve magnetoresistive (SVMR) sensor element with an enhanced magnetoresistive (MR) resistivity sensitivity. The spin valve magnetoresistive (SVMR) sensor element exhibits the enhanced magnetoresistive (MR) resistivity sensitivity since there is employed when fabricating the spin valve magnetoresistive (SVMR) sensor element: (1) a seed layer 12 formed of a magnetoresistive (MR) resistivity sensitivity enhancing material selected from the group consisting of nickel-chromium alloys and nickel-iron-chromium alloys, in turn having formed thereupon; (2) a metal oxide buffer layer 13 (e.g., nickel oxide material or alpha $-Fe_2O_3$ layer), in turn having formed thereupon; (3) a free ferromagnetic layer 14 formed of a magnetoresistive (MR) ferromagnetic material within the spin-valve magnetoresistive (SVMR) sensor element.

Although not specifically illustrated within the schematic air bearing surface (ABS) view diagram of FIG. 1, to be fully operational, the spin valve magnetoresistive (SVMR) sensor element whose schematic air bearing surface (ABS) view diagram is illustrated within FIG. 1 must have magnetization directions of the free ferromagnetic layer 14 and the pinned ferromagnetic layer 18 fixed with respect to each other, typically and preferably in orthogonal directions. Typically and preferably, the magnetization direction of the free ferromagnetic layer 14 will be parallel to the plane of the air bearing surface (ABS) of the spin valve magnetoresistive (SVMR) sensor element whose schematic air bearing surface (ABS) view diagram is illustrated within FIG. 1 and coincide with the long axis of the free ferromagnetic layer 14. Similarly, typically and preferably, the magnetization direction of the pinned ferromagnetic layer 18 will be perpendicular to the plane of air bearing surface (ABS) of the spin valve magnetoresistive (SVMR) sensor element whose schematic air bearing surface (ABS) view diagram is illustrated in FIG. 1. Such magnetization directions may be obtained employing magnetically assisted thermal annealing methods (at temperatures of up to about 280 degrees centigrade for time periods of up to about 5 hours) and magnetically assisted deposition methods as are conventional in the art of spin-valve magnetoresistive (SVMR) sensor element fabrication.

L. Additional Layers

As is understood by a person skilled in the art, the spin valve magnetoresistive (SVMR) sensor element whose schematic air bearing surface (ABS) view diagram is illustrated in FIG. 1 may be further fabricated employing layers and structures as are conventional in the art of spin valve magnetoresistive (SVMR) sensor element fabrication to provide a spin valve magnetoresistive (SVMR) sensor element which is fully functional within a magnetic data storage and transduction application within which is employed the spin valve magnetoresistive (SVMR) sensor element. Such additional layers and structures may include, but are not limited shield layers and structures, passivation layers and structures, conductor contact layers and structures and inductive magnetic write pole layers and structures. Resulting from such additional layers and structures fabricated incorporating the spin valve magnetoresistive (SVMR) sensor element whose schematic air bearing surface (ABS) view diagram is illustrated within FIG. 1 may be a magnetic head selected from the group including but not limited to magnetoresistive read only magnetic heads, merged inductive write magnetoresistive read magnetic heads (which employ a pertinent magnetic material layer as both a shield layer for isolating a spin valve magnetoresistive sensor element within the merged inductive write magnetoresistive read magnetic head and as a magnetic inductor write pole layer within the merged inductive write magnetoresistive read magnetic head), and non-merged inductive magnetic write magnetoresistive read magnetic heads.

Figure 2:
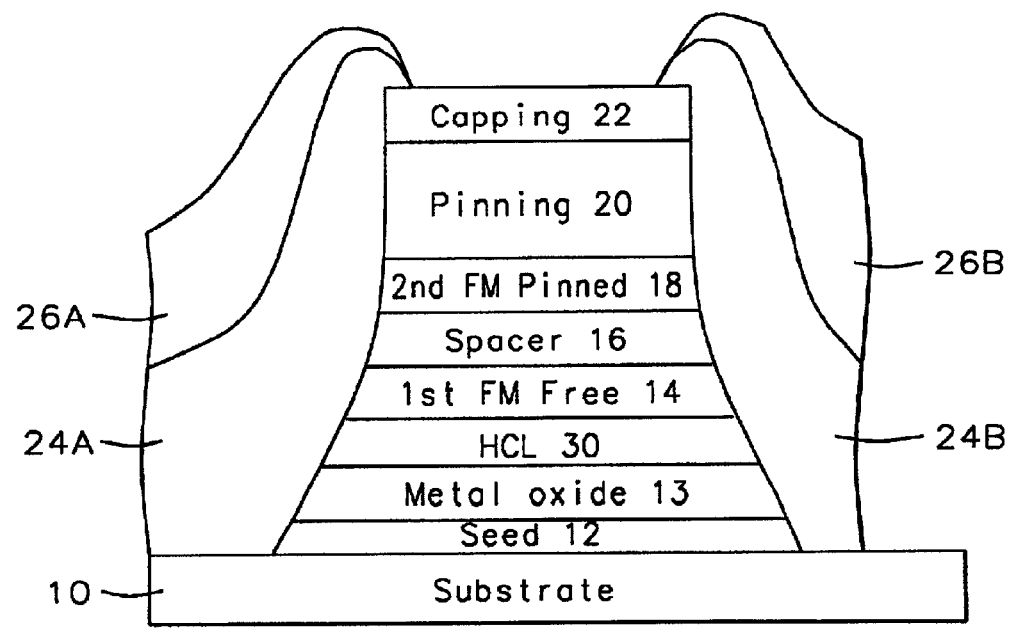
FIG. 2 shows a schematic air bearing surface (ABS) view diagram illustrating a spin filter Spin Valve giant magnetoresistance (SF-SVGMR) sensor element fabricated in accord with a preferred second embodiment of the present invention. The SF-SVGMR has a HCL layer 30 as contrasted with the GMR in FIG 1.

$2^{nd}$ Embodiment—Spin Filter Spin Valve Sensor— FIG. 2

FIG. 2 shows a schematic air bearing surface (ABS) view diagram illustrating a spin filter Spin Valve giant magnetoresistance (SF-SVGMR) sensor element fabricated in accord with a preferred second embodiment of the present invention. The SF-SVGMR has a HCL layer 30 as contrasted with the GMR in FIG. 1.

For the $2^{nd}$ embodiment (SF-SVGMR) all layers, except the HCL layer 30, are formed as described above in the first embodiment.

The high conductivity (HCL) layer 30 is preferably comprised of Cu or Cu—Ni. The HCL layer 30 preferably has a thickness of between about 10 and 30. The HCL layer 30 creates the Spin filter effect of the SF-SVGMR.

$3^{rd}$ Embodiment—Second FM Pinned Layer 18— FIG. 3B

For example and without limitation, such a synthetic antiferromagnetically biased giant magnetoresistive (GMR) sensor element may be fabricated employing methods and materials analogous or equivalent to the methods and materials employed for forming the simple spin valve magnetoresistive sensor element in accord with the preferred embodiment of the present invention but wherein the pinned ferromagnetic material layer is a trilayer comprising a pair of cobalt-iron alloy ferromagnetic material layers separated by an non-magnetic conductor spacer layer, such as but not limited to a ruthenium non-magnetic conductor spacer layer of thickness from about 5 to about 9 angstroms.

Referring to FIG. 3A and 3B, the pinned ferromagnetic layer 18 ($2^{nd}$ FM pinned See FIG. 3A) can be composed of a three layer structure comprising: (a) a lower AP1 layer (18A); a non- magnetic spacer (e.g., Ru) layer 18B and a upper AP layer (AP2 layer) 18C wherein the spacer layer 18B induces anti-ferromagnetic coupling between AP1 and AP2 which enhances the Pinning effect. AP stands for Anti-parallel. The arrows shown in FIG. 3B show an example of the anti-parallel orientation of the magnetization. Other AP orientations are possible.

The lower AP1 layer (18A), 18B and a upper AP layer (AP2 layer) 18C preferably have a thickness of between about 5 and 20 Å and are comprised of CoFe and said spacer layer 18B has a thickness of between about 5 and 10 Å.

TABLE $3^{rd}$ embodiment - compositions of Tri-layer $2^{nd}$ FM layers 19 (18A, 18B, 18C) See FIG. 3B.

| Layer | Preferred compositions | Preferred parameters (e.g., thickness) |
| --- | --- | --- |
| AP2 layer 18C | CoFe (Co: 70 to 95%); Fe: 5 to 20 weight %) Co or NiFe | 5 to 20 Å |

TABLE-continued

3rd embodiment - compositions of Tri-layer 2nd FM layers 19
(18A, 18B, 18C) See FIG. 3B.

| Layer | Preferred compositions | Preferred parameters (e.g., thickness) |
|---|---|---|
| non-magnetic spacer layer 18B | Ru | 5 to 10 Å |
| AP1 layer 18A | CoFe (Co: 70 to 95%); Fe: 5 to 30 weight %) Co or NiFe | 5 to 20 Å |

The spacer layer 18B induces anti-ferromagnetic coupling between AP1 and Ap2 which enhances the pining effect as compared to FIG. 3A configuration.

An explicit, but not limiting, example of materials layering within such a synthetic giant magnetoresistive (GMR) sensor element is as follows:

NiFeCr/Alpha-Fe2O3/NiFe+CoFe/Cu/CoFe/Ru/CoFe/PtMn.

A. FIG. 4—Simulated Results

FIG. 4 shows a graph of the simulated results of a spin filter SV having the configuration 509Ta/HCL/CoFe/Cu25/CoFe20/IrNm50/Ta50. The graph shows the GMR ratio of the Spin Filter spin valve as a function of interface specular scattering. The results of the Ta interface is represented by the dashed line (p=0.3). Significant gain in the GMR ratio if the specular scatter factor is improved such as by the $2^{nd}$ embodiments HCL layer. The P values in the legend are the interface specular scattering coefficient. The x-axis plots the HCL layer 30 thickness and the y-axis is the GMR effect %. The larger the P value, the larger the GMR effect. Materials like NiO and alpha-FeO3 can be used to achieve larger P values at the interface and hence larger GMR effect.

Similarly, also for example and without limitation, such a simple spin filter giant magnetoresistive (GMR) sensor element may be fabricated employing methods and materials analogous or equivalent to the methods and materials employed for forming the simple spin valve magnetoresistive (SVMR) sensor element in accord with the preferred embodiment of the present invention, but wherein there is formed interposed between the nickel oxide material layer and the free ferromagnetic material layer an additional non-magnetic conductor layer, such as a copper non-magnetic conductor layer, formed to a thickness of from about 5 to about 15 angstroms. An explicit, but not limiting, example of materials layering within such a spin filter giant magnetoresistive (GMR) sensor element is as follows:

NiFeCr/NiO/Cu/CoFe/Cu/CoFe/PtMn or NiFeCr/alpha-Fe2O3/Cu/CoFe/Cu/CoFe/PtMn.

B. Summary

Under such circumstances, and in accord with the first preferred embodiment of the present invention, such other giant magnetoresistive (GMR) sensor elements with enhanced magnetoresistive (NM) resistivity sensitivity are fabricated in accord with the present invention by employing: (1) a seed layer (12) of a magnetoresistive (MR) resistivity sensitivity enhancing material selected from the group consisting of nickel-chromium alloys and nickel-iron-chromium alloys, in turn having formed thereupon; (2) a metal oxide material layer (13), further in turn having formed thereover; (3) a free ferromagnetic layer (14).

Under such circumstances, and in accord with the second preferred embodiment of the present invention, such other giant magnetoresistive (GMR) sensor elements with enhanced magnetoresistive (MR) resistivity sensitivity are fabricated in accord with the present invention by employing: (1) a seed layer (12) of a magnetoresistive (MR) resistivity sensitivity enhancing material selected from the group consisting of nickel-chromium alloys and nickel-iron-chromium alloys, in turn having formed thereupon; (2) a metal oxide material layer (13), further in turn having formed thereover, (3) a high conductivity layer (30); and a (4) free ferromagnetic layer (14).

The $3^{rd}$ embodiment is a FM layer 18 comprised of 3 layers. The FM layer 18A 18B and 18C are incorporated into the structures of the $1^{st}$ and $2^{nd}$ embodiments.

Finally, while the spin valve magnetoresistive (SVMR) sensor element in accord with the preferred embodiment of the present invention is illustrated as having each of the pertinent seed layer 12, metal oxide layer 13 and free ferromagnetic layer 14 as a stack of layers one formed upon the other, more generally, within a giant magnetoresistive (GMR) sensor element formed in accord with the present invention, corresponding layers may be formed over each other rather than necessarily upon each other. Such layers when formed over each other may have formed interposed therebetween additional layers, such as is illustrated, for example and without limitation, by one of the copper layers within the simple spin filter giant magnetoresistive (GMR) sensor element or the spin filter synthetic antiferromagnetically biased giant magnetoresistive (GMR) sensor element as is disclosed above, Similarly, in concert with that which is noted above, the present invention is not limited to forming with an enhanced magnetoresistive resistivity sensitivity only a spin valve magnetoresistive (SVMR) sensor element, but may also be employed for forming with enhanced magnetoresistive (MR) resistivity sensitivity giant magnetoresistive (GMR) sensor elements including but not limited to simple spin valve magnetoresistive (SVMR) sensor elements, synthetic antiferromagnetically biased giant magnetoresistive (GMR) sensor elements, simple spin filter giant magnetoresistive (GMR) sensor elements and spin filter synthetic antiferromagnetically biased giant magnetoresistive (GMR) sensor elements.

Although the preferred embodiment of the present invention illustrates the present invention within the context of fabricating a simple spin valve magnetoresistive (SVMR) sensor element which may be employed within digitally encoded magnetic data storage and retrieval while employing a direct access storage device (DASD) magnetic data storage enclosure, the present invention may also be employed for forming with enhanced magnetoresistive (MR) resistivity sensitivity giant magnetoresistive (GMR) sensor elements including but not limited to simple spin valve magnetoresistive (SVMR) sensor elements, synthetic anti-ferromagnetically biased giant magnetoresistive (GMR) sensor elements, simple spin filter giant magnetoresistive (GMR) sensor elements and spin filter synthetic anti-ferromagnetically biased giant magnetoresistive (GMR) sensor elements employed within: (1) digitally encoded magnetic data storage and transduction applications other than those employing direct access storage device (DASD) magnetic data storage enclosures; as well as (2) various analog magnetic data storage and transduction applications.

As is understood by a person skilled in the art, the preferred embodiment and examples of the present invention are illustrative of the present invention rather than limiting of the present invention. Revisions and modification may be made to methods, materials, structures and dimensions employed for forming a giant magnetoresistive (GMR) sensor element, such as but not limited to a spin-valve magnetoresistive (SVMR) sensor element in accord with the preferred embodiment of the present invention, while still providing a giant magnetoresistive (GMR) sensor element in accord with the spirit and scope of the present invention, as defined by the appended claims.

What is claimed is:

1. A spin valve giant magnetoresistance (SVGMR) sensor comprising:
   a seed layer over a substrate, said seed layer formed of a material selected from the group consisting of nickel chromium alloys, nickel-chromium-copper alloys and nickel-iron-chromium alloys;
   a metal oxide buffer layer over the seed layer; said metal oxide buffer layer is comprised of alpha—$Fe_2O_3$ and has a thickness of between about 5 to 15 Å;
   a free ferromagnetic layer over said metal oxide buffer layer; said metal oxide buffer layer and said free ferromagnetic layer have about the same crystal lattice constants; and said metal oxide buffer layer and said free ferromagnetic layer have the same crystal structure;
   a non-magnetic conductor spacer layer over said free ferromagnetic layer;
   a pinned ferromagnetic layer over the non-magnetic conductor spacer layer; and
   a pinning material layer over the pinned ferromagnetic layer; and
   a capping layer over said pinning material layer.

2. The spin valve giant magnetoresistance (SVGMR) sensor of claim 1 which further includes: a high conductivity layer on said metal oxide buffer layer and said free ferromagnetic layer on said high conductivity layer.

3. The spin valve giant magnetoresistance (SVGMR) sensor of claim 1 which further includes: a high conductivity layer on said metal oxide buffer layer and said free ferromagnetic layer on said high conductivity layer (HCL); said high conductivity layer is comprised of Cu or Cu—Ni and has a thickness between 10 and 30 Å.

4. The method of claim 1 wherein said pinned ferromagnetic layer is composed of a three layer structure comprising: (a) a lower AP layer, a middle non-magnetic conductor spacer layer and a upper AP layer wherein said middle non-magnetic conductor spacer layer induces anti-ferromagnetic coupling between said lower AP layer and said upper AP layer which enhances the Pinning effect.

5. The spin valve giant magnetoresistance sensor of claim 1 wherein said pinned ferromagnetic layer is composed of a three layer structure comprising: (a) a lower AP layer, (b) a Ru layer and (c) an upper AP layer wherein said Ru layer induces anti-ferromagnetic coupling between said lower AP layer and said AP upper which enhances the pinning effect and where said lower AP layer and said upper AP layer have a thickness of between about 5 and 20 Å and are comprised of CoFe and said Ru layer has a thickness of between about 5 and 10 Å.

6. The spin valve giant magnetoresistance sensor of claim 1 wherein said seed layer is comprised of: NiFeCr.

7. The spin valve giant magnetoresistance sensor of claim 1 wherein said free ferromagnetic layer is comprised of: CoFe, CoFe/NiFe, or Co/NiFe and has a thickness of 20 to 30 Å.

8. The spin valve giant magnetoresistance sensor of claim 1 wherein said non-magnetic conductor spacer layer is composed of Cu having a thickness of between about 20 and 30 Å.

9. The spin valve giant magnetoresistance sensor of claim 1 wherein the free ferromagnetic material layer and the pinned ferromagnetic material layer are each formed of a ferromagnetic material selected from the group consisting of nickel, iron and cobalt ferromagnetic materials, alloys thereof, laminates thereof and laminates of alloys thereof.

10. The spin valve giant magnetoresistance (SVGMR) sensor of claim 1 wherein said pinned ferromagnetic layer is comprised of a material selected from the group consisting of CoFe, and Co; and has a thickness of between about 10 and 30 Å.

11. The spin valve giant magnetoresistance (SVGMR) sensor of claim 1 wherein a pinning material layer is comprised of a material selected from the group consisting of MnPt, IrMn, and MnNi; and has a thickness of between about 50 and 300 Å.

12. The spin valve giant magnetoresistance (SVGMR) sensor of claim 1 wherein said capping layer consists of a material selected from the group consisting of: MiFeCo, NiCr, and Ta, and has a thickness of between about 40 and 60 Å.

* * * * *